(12) United States Patent
Shim (10) Patent No.: US 9,117,540 B2
(45) Date of Patent: Aug. 25, 2015

(54) SEMICONDUCTOR MEMORY DEVICE INCLUDING MEMORY CELL STRINGS AND METHOD OF OPERATING THE SAME

(71) Applicant: SK hynix Inc., Icheon-si Gyeonggi-do (KR)

(72) Inventor: Jung Woon Shim, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 169 days.

(21) Appl. No.: 13/971,315

(22) Filed: Aug. 20, 2013

(65) Prior Publication Data

US 2014/0347921 A1 Nov. 27, 2014

(30) Foreign Application Priority Data

May 21, 2013 (KR) ........................ 10-2013-0057046

(51) Int. Cl.
*G11C 16/34* (2006.01)
*G11C 16/04* (2006.01)
*G11C 16/26* (2006.01)

(52) U.S. Cl.
CPC ........ *G11C 16/3427* (2013.01); *G11C 16/0441* (2013.01); *G11C 16/0483* (2013.01); *G11C 16/26* (2013.01); *G11C 16/3418* (2013.01); *G11C 16/3436* (2013.01)

(58) Field of Classification Search
CPC ........... G11C 16/3427; G11C 16/0483; G11C 16/26; G11C 16/3418; G11C 16/3436; G11C 16/0441

See application file for complete search history.

(56) References Cited

U.S. PATENT DOCUMENTS

| 5,812,454 | A  | * | 9/1998 | Choi ........................ 365/185.17 |
| 5,936,887 | A  | * | 8/1999 | Choi et al. ............... 365/185.17 |
| 2005/0073001 | A1 | * | 4/2005 | Kamigaichi et al. .......... 257/315 |
| 2009/0109754 | A1 | * | 4/2009 | Schumann et al. ....... 365/185.11 |
| 2010/0097859 | A1 | * | 4/2010 | Shim et al. ............... 365/185.05 |
| 2011/0199804 | A1 | * | 8/2011 | Son et al. ........................ 365/51 |
| 2013/0294155 | A1 | * | 11/2013 | Chen et al. ............... 365/185.02 |

FOREIGN PATENT DOCUMENTS

| KR | 1020090128776 A | 12/2009 |
| KR | 1020110001100 A | 1/2011 |

* cited by examiner

*Primary Examiner* — J. H. Hur
(74) *Attorney, Agent, or Firm* — William Park & Associates (57) ABSTRACT

A semiconductor memory device includes memory cell strings including selection transistors and memory cells coupled between the selection transistors, a peripheral circuit configured to apply an operating voltage to the memory cell strings during a read operation or a verify operation, and a control circuit configured to control the peripheral circuit so that the operating voltage being applied to the selection transistors is controlled to reduce a potential level of a channel of the memory cell strings during the read operation or the verify operation.

17 Claims, 5 Drawing Sheets

SEMICONDUCTOR MEMORY DEVICE INCLUDING MEMORY CELL STRINGS AND METHOD OF OPERATING THE SAME

CROSS-REFERENCE TO RELATED APPLICATION

The present application claims priority to Korean patent application number 10-2013-0057046 filed on May 21, 2013, in the Korean Intellectual Property Office, the entire disclosure of which is incorporated by reference herein.

BACKGROUND

1. Technical Field

Various embodiments generally relate generally to a semiconductor memory device and a method of operating the same and, more particularly, to a semiconductor memory device having a three-dimensional structure and a method of operating the same.

2. Related Art

Among semiconductor memory devices, a NAND flash memory device is a typical non-volatile memory device. A memory array of a NAND flash memory device includes a plurality of memory blocks. Each of the memory blocks includes a plurality of memory cell strings. Each of the memory cell strings is coupled between a bit line and a common source line. More specifically, each of the memory strings includes a plurality of memory cells that are coupled in series between a drain selection transistor and a source selection transistor. The drain selection transistor may have a drain coupled to the bit line, and the source selection transistor may have a source coupled to the common source line.

In general, a memory cell string is two-dimensionally formed on a substrate. In order to increase the degree of integration, a cell size is to be reduced. However, two-dimensional memory strings are reaching physical limits in reducing the cell size. Accordingly, three-dimensional non-volatile memory strings have been proposed.

A memory cell string may include a vertical channel layer that is formed in a vertical direction to a semiconductor substrate, a memory layer that includes a charge storage layer and an insulating layer formed on a surface of the vertical channel layer, a conductive layer configured as a word line and a conductive layer configured as a selection line (drain selection line or source selection line) that are penetrated by the vertical channel layer, and an insulating layer that is formed between the conductive layer configured as the word line and the conductive layer configured as the selection line.

Figure 1:
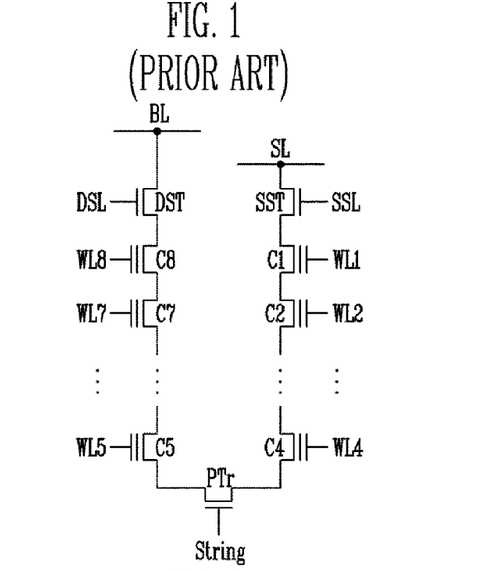
FIG. 1 is a circuit diagram of a memory cell string of a semiconductor memory device having a pipe-shaped bit cost scalable (PBiCS)

FIG. 1 is a circuit diagram of a memory cell string of a semiconductor device having a pipe-shaped bit cost scalable (PBiCS) structure.

Referring to FIG. 1, a memory cell string of a semiconductor memory device may include first group memory cells C1 to C4 and second group memory cells C5 to C8. The first group memory cells C1 to C4 may be coupled in series between a source selection transistor SST, coupled to a source line SL, and a pipe transistor PTr. The second group memory cells C5 to C8 may be coupled in series between a drain selection transistor DST, coupled to a bit line BL, and the pipe transistor PTr.

The pipe transistor PTr may electrically connect a channel region of the first group memory cells C1 to C4 to a channel region of the second group memory cells C5 to C8 in response to a string selection signal String.

FIG. 1 also illustrates drain selection line DSL, source selection line SSL and word lines WL1-WL8.

SUMMARY

Various embodiments generally relate to a semiconductor memory device and a method of operating the same that can suppress a read disturbance phenomenon by preventing changes in threshold voltages of unselected memory cells during an operation of sensing threshold voltages of memory cells, such as a read operation, a program verify operation and an erase verify operation.

A semiconductor memory device according to an embodiment of the present invention includes memory cell strings including selection transistors and memory cells coupled between the selection transistors, a peripheral circuit configured to apply an operating voltage to the memory cell strings during a read operation or a verify operation, and a control circuit configured to control the peripheral circuit so that the operating voltage being applied to the selection transistors is controlled to reduce a potential level of a channel of the memory cell strings during the read operation or the verify operation.

A semiconductor memory device according to an embodiment of the present invention includes a first memory cell string and a second memory cell string coupled between a bit line and a source line, first selection lines configured to apply an operating voltage to a drain selection transistor and a source selection transistor of the first memory cell string, second selection lines configured to apply the operating voltage of a drain selection transistor and a source selection transistor of the second memory cell string, and word lines coupled to memory cells of the first and second memory cell strings, wherein an operating voltage is applied to the first selection lines and the second selection lines so that a channel of the first and second memory cell strings is not boosted during a read operation or a verify operation.

A method of operating a semiconductor memory device according to an embodiment of the present invention includes providing a plurality of memory cell strings sharing a bit line, applying an operating voltage to drain selection transistors of the memory cell strings, applying a read voltage or a verify voltage to a selected memory cell, among memory cells of the plurality of memory cell strings, and applying a pass voltage to remaining memory cells, and applying the operating voltage to source selection transistors of the memory cell strings.

DETAILED DESCRIPTION

Hereinafter, various embodiments will be described in detail with reference to the accompanying drawings. The figures are provided to allow those having ordinary skill in the art to understand the scope of the embodiments of the disclosure. Wherever possible, the same reference numbers will be used throughout the drawings to refer to the same or like parts. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 2:
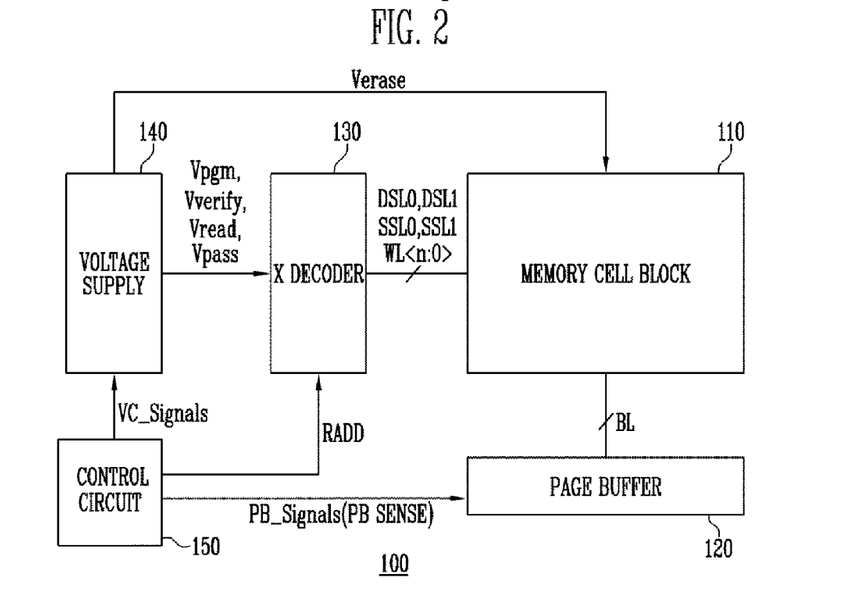
FIG. 2 is a block diagram of the configuration of a semiconductor memory device according to an embodiment of the present invention.

FIG. 2 is a block diagram of the configuration of a semiconductor memory device according to an embodiment of the present invention.

Referring to FIG. 2, a semiconductor memory device 100 may include a memory cell block 110, a page buffer 120, an X decoder 130, a power supply 140 (i.e., voltage supply) and a control circuit 150.

The memory cell block 110 may include a plurality of memory cells. A detailed configuration of the memory cell block 110 is described below in detail.

The page buffer 120 may be coupled to a plurality of bit lines BL of the memory cell block 110. The page buffer 120 may sense threshold voltages of the memory cells by using potentials of the bit lines BL during a read operation, a program verify operation and an erase verify operation in response to page buffer control signals PB_Signals (PB SENSE) output from the control circuit 150.

The X decoder 130 may apply operating voltages, generated from the power supply 140, to a plurality of word lines WL<n:0> and drain and source selection lines DSL0, DSL1, SSL0 and SSL1 of the memory cell block 110 in response to a row address RADD output from the control circuit 150.

The power supply 140 may generate an erase voltage Verase to be applied to a P well of a semiconductor substrate, in which the memory cell block 110 is formed, during an erase operation and may generate a verify voltage Vverify during a program verify operation and an erase verify operation in response to power supply control signals VC_Signals, output from the control circuit 150. In addition, the power supply 140 may generate a program voltage Vpgm to be applied to a selected word line during a program operation and a read voltage Vread to be applied to the selected word line during a read operation.

The control circuit 150 may generate the power supply control signals VC_Signals and the page buffer control signals PB_Signals to control the power supply 140 and the page buffer 120 during a program operation, an erase operation, a read operation, a program verify operation and an erase verify operation.

In addition, in order to prevent a read disturbance phenomenon from occurring in a selected memory cell string of the memory cell block 110 during the read operation, the control circuit 150 may output the power supply control signals VC_Signals and the row address RADD to control the power supply 140 and the X decoder so that a source selection transistor of the selected memory cell string may be turned on for a predetermined period of time and a potential of a boosted channel may fall.

In addition, in order to prevent a read disturbance phenomenon from occurring in an unselected memory cell string of the memory cell block 110 during a read operation, the control circuit 150 may output the power supply control signals VC_Signals and the row address RADD to control the power supply 140 and the X decoder so that a drain selection transistor of the unselected memory cell string may be turned on for a predetermined period of time and a potential of a boosted channel may fall.

Figure 3:
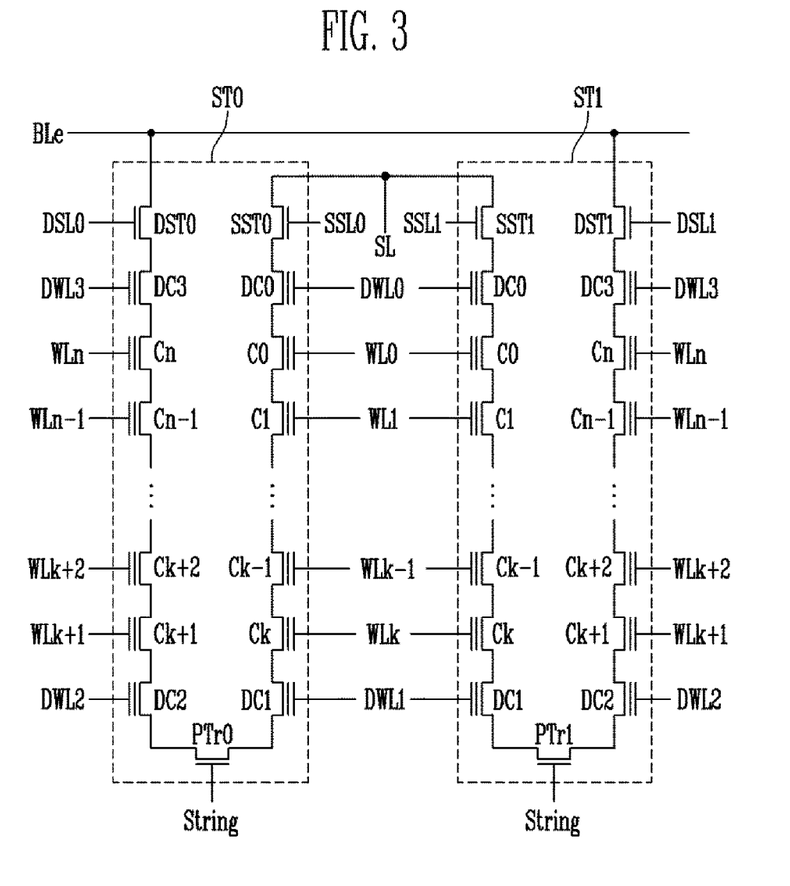
FIG. 3 is a circuit diagram of a memory cell block of a memory semiconductor device according to an embodiment of the present invention.

FIG. 3 is a circuit diagram of a memory cell block of the semiconductor memory device of FIG. 2.

In the memory cell block of FIG. 3, memory cell strings ST0 and ST1 may be coupled to a single bit line BLe. In addition, the memory cell strings ST0 and ST1 may be coupled to a single source line SL.

In general, in a memory cell block, a plurality of bit lines may be arranged in parallel with each other, and a plurality of memory cell strings may be coupled to a single bit line. However, in FIG. 3, two memory cell string may be coupled to a single bit line for illustrative purposes. However, the present invention is not limited thereto. For example, as for a bit line coupled to cell strings, an even bit line and an odd bit line may be arranged, and a plurality of cell strings may be coupled to the even bit line and the odd bit line. In addition, the cell strings may be coupled in common to a single source line or different source lines, respectively.

A structure of the memory cell string ST0 may be substantially similar to a structure of the memory cell string ST1.

The memory cell string ST0 may include a drain selection transistor DST0 (see also DST1 for memory cell string ST1), dummy transistors DC0 to DC3, memory cells C0 to Cn and Ck+2 to CK−1, word lines WLn to WL0 and WLk+2 to WLk−1, dummy word lines DWL3 to DWL0, a pipe transistor PTr0 and a source selection transistor SST0.

The memory cells C0 to Cn may be coupled in series with each other, and the pipe transistor PTr0 may be located in the middle of the memory cells C0 to Cn. In addition, dummy transistors DC0 to DC3 may be located at both edges of the memory cells C0 to Cn and at both sides of the pipe transistor PTr0. In addition, the drain selection transistor DST0 may be coupled between the bit line BLe and the dummy transistor DC3, and the source selection transistor SST0 may be coupled between the source line SL and the dummy transistor DC0. According to an embodiment of the present invention, a description has been made in reference to a case in which the dummy transistors DC0 to DC3 are arranged. However, the dummy transistors DC0 to DC3 may be removed according to a designer's intention.

The memory cell strings ST0 and ST1, coupled to the single bit line BLe, may be coupled to different drain selection lines DSL0 and DSL1 and different source selection lines SSL0 and SSL1, respectively. The pipe transistors PTr0 and PTr1 of the memory cell strings may operate in response to the same signal, for example, a signal String.

Figure 4A:
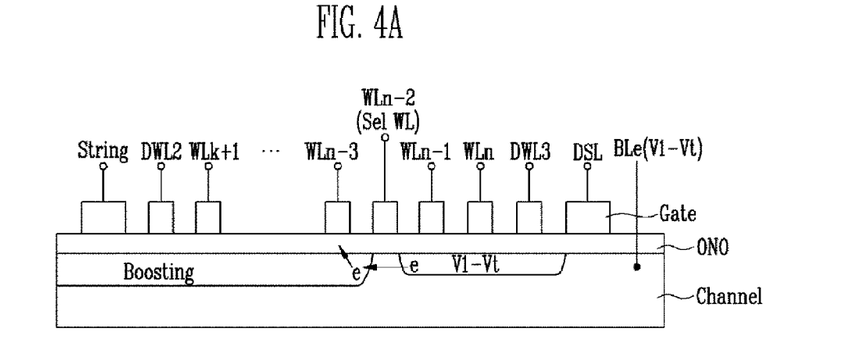
FIG. 4A is a cross-sectional view of a device for illustrating a read disturbance phenomenon of a selected memory cell string.

FIG. 4A is a cross-sectional view of a device for illustrating operations of the selected memory cell string of the memory cell block of FIG. 3.

Referring to FIG. 4A, operations of the selected memory cell string ST0 between the memory cell strings ST0 and ST1 during a sensing operation, such as a read operation, a program verify operation or an erase verify operation, are described below.

First, an operating voltage may be applied to the drain selection line DSL, and the drain selection transistor may be turned on. As a result, a channel of the selected memory cell string ST0 may be electrically coupled to the bit line BLe having a potential V1-Vt. A read voltage or a verify voltage may be applied to the word line WLn-2 coupled to the selected memory cell, and a pass voltage may be applied to the other word lines and dummy word lines, so that a channel under the selected memory cell may be boosted. When a threshold voltage of the selected memory cell is greater than the read voltage or the verify voltage, the selected memory cell may be turned off, and the boosted channel may be electrically disconnected. A channel in a bit line direction on the basis of the selected memory cell may be coupled to the bit line having the potential V1-Vt, while a channel in a source line direction may have a higher boosting level than the channel potential V1-Vt since the source selection transistor is turned on. Therefore, hot carrier electrons (i.e., e) may move from the channel having the potential V1-Vt to an adjacent boosting channel (i.e., Boosting, channel) and be injected into a memory layer of a memory cell adjacent to the selected memory cell. As a result, a read disturbance phenomenon may occur in which a threshold voltage of the memory cell may change. FIG. 4A also illustrates a gate Gate, ONO layer (i.e., oxide-nitride-oxide layer).

The read disturbance phenomenon may also occur in a memory cell string of an unselected bit line, which shares a drain selection line, a source selection line and word lines with the selected memory cell string of the selected bit line, as well as in the selected memory cell string of the selected bit line.

Figure 4B:
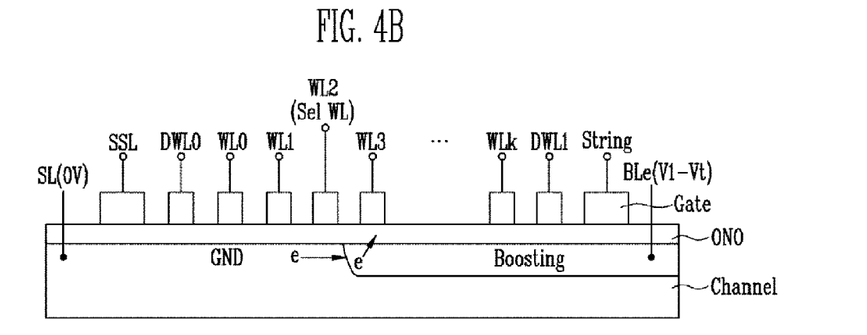
FIG. 4B is a cross-sectional view of a device for illustrating a read disturbance phenomenon of an unselected memory cell string.

FIG. 4B is a cross-sectional view of a semiconductor memory device for illustrating operations of a selected memory cell string of the memory cell block of FIG. 3.

Operations of an unselected memory cell string, among a plurality of memory cell strings, during a sensing operation such as a read operation, a program verify operation or an erase verify operation are described below with reference to FIG. 4B.

In the unselected memory cell string, a voltage having a low voltage level may be applied to the drain selection line DSL, and the drain selection transistor may be turned off. As a result, the selected memory cell string may be electrically disconnected from the bit line. On the other hand, operating voltages may be applied to the source selection line to turn on the source selection transistor, so that the source line SL having a ground potential level may be coupled to a channel. Since the selected memory cell string and the unselected memory cell string share the word lines, a read voltage or a verify voltage and pass voltages being applied to the selected memory cell string may also be applied to the unselected memory cell string. When the threshold voltage of the selected memory cell is less than the read voltage or the verify voltage, the selected memory cell may be turned off, and the boosted channel may be electrically disconnected. As a result, the channel in the bit line direction on the basis of the memory cell coupled to the selected word line WL2 may be boosted by the pass voltage. The channel in the source line direction on the basis of the memory cell coupled to the selected word line WL2 may maintain a ground level GND. As a result, hot carrier electrons may move from the channel having the potential of the ground level GND to a neighboring boosting channel and may be injected into a memory layer of a memory cell adjacent to the selected memory cell. As a result, a read disturbance phenomenon may occur in which the threshold voltage of the memory cell changes.

The read disturbance phenomenon may also occur in a memory cell string of an unselected bit line, which shares a drain selection line, a source selection line and word lines with the selected memory cell string of the selected bit line, as well as in the selected memory cell string of the selected bit line.

Figure 5:
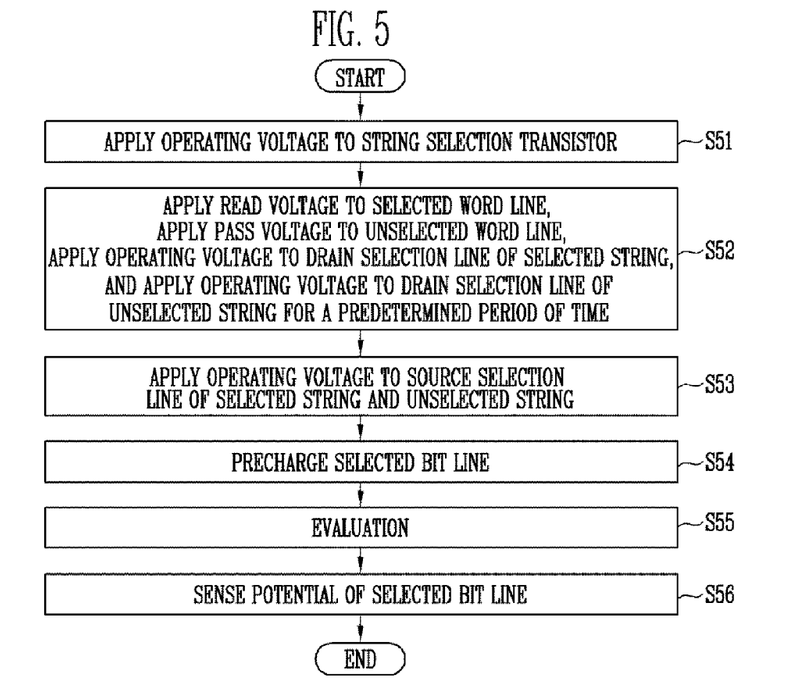
FIG. 5 is a flowchart illustrating operations of a semiconductor memory device according to an embodiment of the present invention.

FIG. 5 is a flowchart illustrating operations of a semiconductor memory device according to an embodiment of the present invention.

Figure 6:
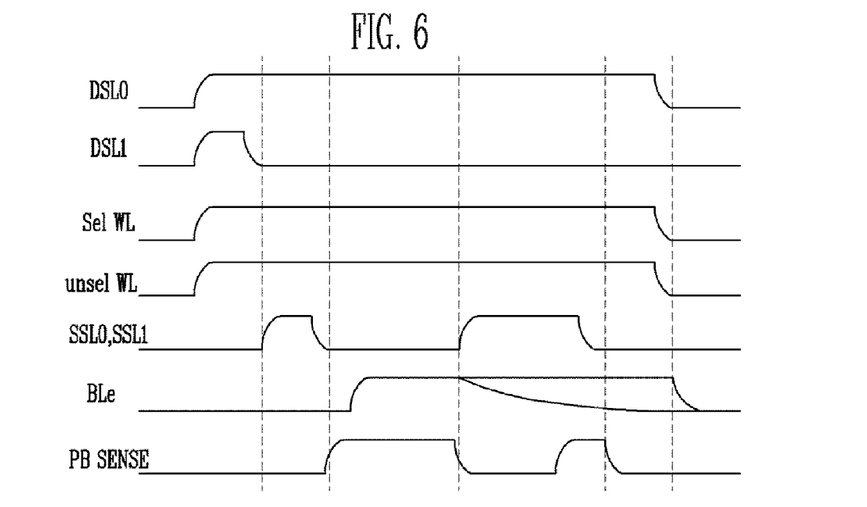
FIG. 6 is a waveform diagram of signals for illustrating operations of a semiconductor memory device according to an embodiment of the present invention.

FIG. 6 is a waveform diagram of signals for illustrating operations of a semiconductor memory device according to an embodiment of the present invention.

Operations of sensing threshold voltages of memory cells, such as a read operation, a program verify operation or an erase verify operation of a semiconductor memory device according to an embodiment of the present invention are described below with reference to FIGS. 2, 3, 5 and 6.

1) Apply Operating Voltage to Pipe Transistor (S51)

A string selection signal String may be applied to the memory cell strings ST0 and ST1, coupled to the single bit line, to turn on the pipe transistors PTr0 and PTr1.

2) Apply Operating Voltage to Word Line and Drain Selection Line (S52)

The read voltage or the verify voltage may be applied to the selected word line Sel WL, and the pass voltage may be applied to the unselected word lines unsel WL. As a result, the selected memory cell coupled to the selected word line Sel WL may be turned on when a threshold voltage is less than the read voltage or the verify voltage and may be turned off when the threshold voltage is greater than the read voltage or the verify voltage. In addition, selected memory cells coupled to the unselected word lines unsel WL may be turned on by the pass voltage regardless of threshold voltage values.

When the read voltage or the verify voltage and the pass voltage are applied to the word lines, operating voltages may be applied to the drain selection line DSL0 of the selected memory cell string ST0. As a result, the drain selection transistor DST0 may be turned on, and the selected memory cell string ST0 may be electrically connected to the bit line BLe having the potential V1-Vt. In addition, the operating voltages may be applied to a drain selection transistor DST1 of the unselected memory cell string ST1 that shares the same bit line BLe with the selected memory cell string ST0 for a predetermined period of time. As a result, the drain selection transistor DST may be turned on for the predetermined period of time by the operating voltages, the unselected memory cell string ST1 and the bit line BLe may be electrically connected to each other, and a portion of the channel of the unselected memory cell string ST0, which is located between the selected memory cell and the drain selection transistor DST1, may not be boosted and may have the potential V1-Vt of the bit line BLe. Accordingly, the read disturbance phenomenon, described with reference to FIG. 4B, may be suppressed.

According to an embodiment of the present invention, a description has been made in reference to a case in which the operating voltages are applied once to the drain selection line DSL1 of the unselected memory cell string ST1 for a predetermined period of time. However, pulses of the operating voltages may be applied twice or more, or a pulse having a potential level that gradually rises or falls may be applied.

3) Apply Operating Voltage to Source Selection Line (S53)

The operating voltages may be applied to the source selection lines SSL0 and SSL1 of the selected memory cell string ST0 and the unselected memory cell string ST1 for a predetermined period of time. As a result, the source selection transistors SST0 and SST1 may be turned on for the predetermined period of time by the operating voltages, and the selected memory cell string ST0 and the unselected memory cell string ST1 may be electrically connected to the source line SL having the ground level GND. Therefore, the portion of the channel of the selected memory cell string ST0, which is located between the selected memory cell and the source selection transistor SST0, may not be boosted and may have the ground level GND. Accordingly, the read disturbance phenomenon of FIG. 4A may be suppressed.

According to an embodiment of the present invention, a description has been made in reference to a case in which the operating voltages are applied once to the source selection lines SSL0 and SSL1 of the selected memory cell string ST0 and the unselected memory cell string ST1 for a predetermined period of time. However, pulses of the operating voltages may be applied twice or more, or a pulse having a potential level that gradually rises or falls may be applied.

4) Precharge Selected Bit Line (S54)

The page buffer 120 may precharge the selected bit line BLe, among the plurality of bit lines, to a high level in response to a page buffer control signal PB SENSE.

5) Evaluation (S55)

When the precharge voltage is blocked after the bit line BLe is precharged, the potential of the bit line BLe may be maintained at a high level or discharged to a low level, depending on a program state of the selected memory cell included in the selected memory cell string ST0 electrically connected to the selected bit line BLe.

6) Sense Potential of Selected Bit Line (S56)

The page buffer 120 may sense the potential of the bit line BLe and latch a result in response to the page buffer control signal PB SENSE.

Figure 7:
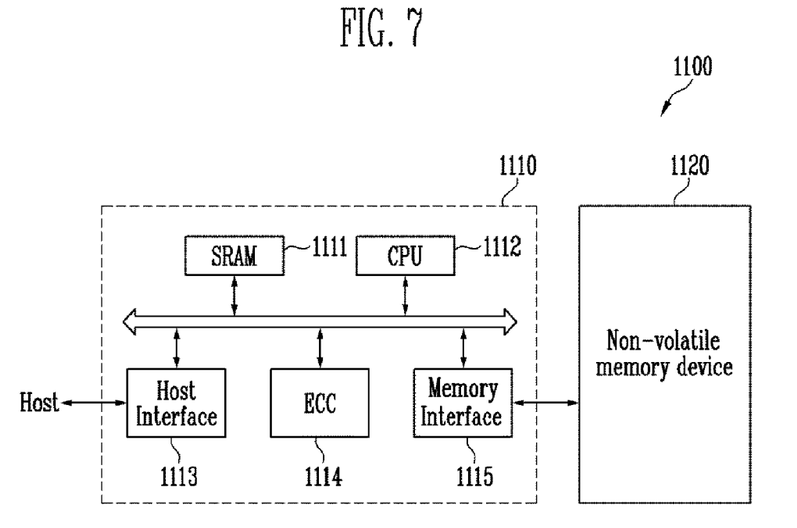
FIG. 7 is a view of the configuration of a memory system to which the semiconductor memory device of FIGS. 2 to 6 is applied.

FIG. 7 is a view illustrating the configuration of a memory system according to an embodiment of the present invention.

As illustrated in FIG. 7, a memory system 1100 according to an embodiment of the present invention may include a non-volatile memory device 1120 and a memory controller 1110.

The non-volatile memory device 1120 may include the semiconductor memory device with reference to the embodiments described above in FIGS. 2 to 6. In addition, the non-volatile memory device 1120 may be a multi-chip package composed of a plurality of flash memory chips.

The memory controller 1110 may be configured to control the non-volatile memory device 1120. The memory controller 1110 may include SRAM 1111, a CPU 1112, a host interface 1113, an ECC 1114 and a memory interface 1115. The SRAM 1111 may function as an operation memory of the CPU 1112. The CPU 1112 may perform the general control operation for data exchange of the memory controller 1110. The host interface 1113 may include a data exchange protocol of a host being coupled to the memory system 1100. In addition, the ECC 1114 may detect and correct errors included in a data read from the non-volatile memory device 1120. The memory interface 1115 may interface with the non-volatile memory device 1120. The memory controller 1110 may further include RCM that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device (e.g., a host) through one of the interface protocols including USB, MMC, PCI-E, SATA, PATA, SCSI, ESDI and IDE, etc.

Figure 8:
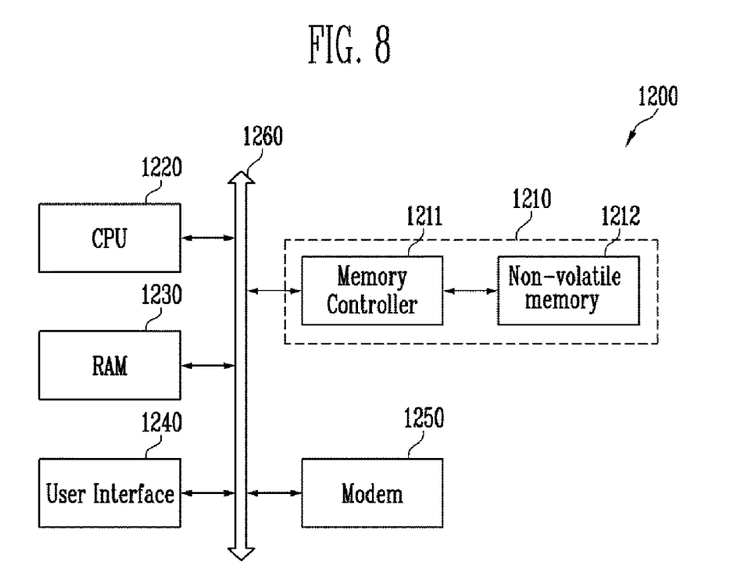
FIG. 8 is a view of the configuration of the memory system of FIG. 7.

FIG. 8 is a block diagram illustrating the configuration of a computing system according to an embodiment of the present invention.

As illustrated in FIG. 8, a computing system 1200 according to an embodiment of the present invention may include a CPU 1220, RAM 1230, a user interface 1240, a modem 1250 and a memory system 1210 that are electrically coupled to a system bus 1260. In addition, when the computing system 1200 is a mobile device, a battery may be further included to apply operating voltages to the computing system 1200. The computing system 1200 may further include application chipsets, a CMOS Image Sensor (CIS) and mobile DRAM.

As described above with reference to FIG. 7, the memory system 1210 may include a non-volatile memory 1212 and a memory controller 1211.

According to the present invention, a read disturbance phenomenon may be suppressed by preventing changes in threshold voltages of unselected memory cells during an operation of sensing threshold voltages of memory cells such as a read operation, a program verify operation and an erase verify operation of a semiconductor memory device.

What is claimed is:

1. A semiconductor memory device, comprising:
    memory cell strings including selection transistors and memory cells coupled between the selection transistors;
    a peripheral circuit configured to apply an operating voltage to the memory cell strings during a read operation or a verify operation; and
    a control circuit configured to control the peripheral circuit so that the operating voltage being applied to the selection transistors is controlled to reduce a potential level of a channel of the memory cell strings during the read operation or the verify operation,
    wherein the operating voltage is applied to a drain selection transistor of an unselected memory cell string, among the memory cell strings, and subsequently to a source selection transistor of the unselected memory cell string, among the memory cell strings.

2. The semiconductor memory device of claim 1, wherein the operating voltage is applied to a source selection transistor of a selected memory cell string, among the memory cell strings, so that a potential of a portion of the channel of the selected memory cell string is at a ground level.

3. The semiconductor memory device of claim 1, wherein the operating voltage is applied to the drain selection transistor and subsequently to the source selection transistor when a read voltage or a verify voltage is applied to the memory cells during the read operation or the verify operation.

4. The semiconductor memory device of claim 1, wherein a potential of a portion of the channel of the unselected memory cell string has a potential level of a corresponding bit line by the operating voltage.

5. The semiconductor memory device of claim 1, wherein the operating voltage has at least one pulse.

6. The semiconductor memory device of claim 1, wherein the operating voltage gradually rises or falls.

7. The semiconductor memory device of claim 1, wherein the memory cell strings share word lines with each other and do not share a drain selection line coupled to the drain selection transistor and a source selection line coupled to the source selection transistor.

8. The semiconductor memory device of claim 1, wherein the peripheral circuit includes:
    a power supply configured to generate a read voltage, a pass voltage and the operating voltage; and an X decoder configured to apply the operating voltage to the selection transistors in response to a row address signal output from the control circuit.

9. A semiconductor memory device, comprising:
a first memory cell string and a second memory cell string coupled between a bit line and a source line;
first selection lines configured to apply an operating voltage to a drain selection transistor and a source selection transistor of the first memory cell string;
second selection lines configured to apply the operating voltage to a drain selection transistor and a source selection transistor of the second memory cell string; and
word lines coupled to memory cells of the first and second memory cell strings,
wherein the operating voltage is applied to the first selection lines and the second selection lines so that a channel of the first and second memory cell strings is not boosted during a read operation or a verify operation, and
wherein the operating voltage is applied to the drain selection transistor of an unselected memory cell string between the first and second memory cell strings and subsequently to the source selection transistors of the first and second memory cell strings.

10. The semiconductor memory device of claim 9, wherein the operating voltage is applied to a source selection line of the selected memory cell string between the first and second memory cell strings for a predetermined period of time so that a potential of a portion of the channel of the selected memory cell string has a ground level.

11. The semiconductor memory device of claim 9, wherein the operating voltage is applied to a drain selection line of the unselected memory cell string between the first and second memory cell strings.

12. The semiconductor memory device of claim 11, wherein a potential of a portion of the channel of the unselected memory cell string has a potential level of the bit line by the operating voltage.

13. The semiconductor memory device of claim 9, wherein the operating voltage has at least one pulse.

14. The semiconductor memory device of claim 9, wherein the operating voltage gradually rises or falls.

15. A method of operating a semiconductor memory device, the method comprising:
providing a plurality of memory cell strings sharing a bit line;
applying an operating voltage to drain selection transistors of the memory cell strings;
applying a read voltage or a verify voltage to a selected memory cell, among memory cells of the plurality of memory cell strings, and applying a pass voltage to remaining memory cells; and
applying the operating voltage to source selection transistors of the memory cell strings,
wherein the applying of the operating voltage to the drain selection transistors comprises applying the operating voltage to a drain selection transistor of an unselected memory cell string, among the memory cell strings, for a predetermined period of time to prevent a portion of a channel of the unselected memory cell string from being boosted.

16. The method of claim 15, wherein the applying of the operating voltage to the source selection transistors comprises applying the operating voltage to the source selection transistors of the selected memory cell string and the unselected memory cell string, among the memory cell strings, for a predetermined period of time to prevent a portion of a channel of the selected memory cell string and a portion of a channel of the unselected memory cell string from being boosted.

17. The method of claim 15, wherein the operating voltage has at least one pulse, or gradually rises or falls.

* * * * *